(12) United States Patent  (10) Patent No.: US 8,709,924 B2
Hanawa et al.  (45) Date of Patent: Apr. 29, 2014

(54) METHOD FOR CONFORMAL PLASMA IMMERSED ION IMPLANTATION ASSISTED BY ATOMIC LAYER DEPOSITION

(75) Inventors: Hiroji Hanawa, Sunnyvale, CA (US); Seon-Mee Cho, Santa Clara, CA (US); Majeed A. Foad, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 387 days.

(21) Appl. No.: 13/038,199

(22) Filed: Mar. 1, 2011

(65) Prior Publication Data

US 2011/0159673 A1 Jun. 30, 2011

Related U.S. Application Data

(62) Division of application No. 12/028,423, filed on Feb. 8, 2008, now abandoned.

(51) Int. Cl.
  *H01L 21/205* (2006.01)
  *H01L 21/22* (2006.01)

(52) U.S. Cl.
  USPC ........................................................ 438/510

(58) Field of Classification Search
  USPC .................. 438/510, 513, 761, 762, 763, 542
  See application file for complete search history.

(56) References Cited

U.S. PATENT DOCUMENTS

| | | | |
|---|---|---|---|
| 5,527,733 A * | 6/1996 | Nishizawa et al. ........... | 438/558 |
| 6,716,713 B2 | 4/2004 | Todd | |
| 6,887,353 B1 | 5/2005 | Ding et al. | |
| 6,921,708 B1 | 7/2005 | Sharan et al. | |
| 7,022,605 B2 | 4/2006 | Doan et al. | |
| 7,247,582 B2 | 7/2007 | Stern et al. | |
| 7,723,154 B1 * | 5/2010 | Adekore et al. .............. | 438/104 |
| 8,053,372 B1 * | 11/2011 | Greer et al. .................... | 438/762 |
| 2003/0070617 A1 * | 4/2003 | Kim et al. ...................... | 118/715 |
| 2004/0178175 A1 * | 9/2004 | Pellin et al. ...................... | 216/58 |
| 2005/0009368 A1 * | 1/2005 | Vaartstra ....................... | 438/784 |
| 2005/0019494 A1 * | 1/2005 | Moghadam et al. ...... | 427/255.32 |
| 2005/0136604 A1 | 6/2005 | Al-Bayati et al. | |
| 2005/0230047 A1 | 10/2005 | Collins et al. | |
| 2006/0032444 A1 * | 2/2006 | Hara .............................. | 118/715 |
| 2006/0148220 A1 | 7/2006 | Lindert et al. | |
| 2006/0228868 A1 | 10/2006 | Ahn et al. | |
| 2006/0264060 A1 | 11/2006 | Ramaswamy et al. | |
| 2007/0049023 A1 * | 3/2007 | Ahn et al. ...................... | 438/685 |
| 2007/0065576 A1 | 3/2007 | Singh et al. | |

(Continued)

FOREIGN PATENT DOCUMENTS

WO WO-2007038164 4/2007

OTHER PUBLICATIONS

International Search Report and Written Opinion of the International Searching Authority mailed Jun. 25, 2009 in International Application No. PCT/US2009/031491 (APPM/011282PCTP).

*Primary Examiner* — Michele Fan
(74) *Attorney, Agent, or Firm* — Patterson & Sheridan, LLP

(57) ABSTRACT

Embodiments of the invention provide a novel apparatus and methods for forming a conformal doped layer on the surface of a substrate. A substrate is provided to a process chamber, and a layer of dopant source material is deposited by plasma deposition, atomic layer deposition, or plasma-assisted atomic layer deposition. The substrate is then subjected to thermal processing to activate and diffuse dopants into the substrate surface.

7 Claims, 8 Drawing Sheets

(56) References Cited

U.S. PATENT DOCUMENTS

| | | |
|---|---|---|
| 2007/0087574 A1 | 4/2007 | Gupta et al. |
| 2007/0087581 A1 | 4/2007 | Singh et al. |
| 2007/0155142 A1 | 7/2007 | Jin et al. |
| 2007/0257294 A1* | 11/2007 | Cheng et al. .......... 257/306 |
| 2007/0286954 A1 | 12/2007 | Tang et al. |
| 2008/0001170 A1 | 1/2008 | Lindert et al. |
| 2008/0085580 A1 | 4/2008 | Doyle et al. |
| 2008/0233288 A1* | 9/2008 | Clark ............ 427/255.394 |
| 2009/0004836 A1 | 1/2009 | Singh et al. |

* cited by examiner

METHOD FOR CONFORMAL PLASMA IMMERSED ION IMPLANTATION ASSISTED BY ATOMIC LAYER DEPOSITION

CROSS-REFERENCE TO RELATED APPLICATIONS

This application is a divisional of U.S. patent application Ser. No. 12/028,423, filed Feb. 8, 2008, now abandoned which is herein incorporated by reference.

BACKGROUND OF THE INVENTION

1. Field of the Invention

Embodiments of the present invention generally relate to the fabrication of semiconductor devices and particularly to the formation of doped regions on a substrate by use of plasma implantation assisted by atomic layer deposition.

2. Description of the Related Art

In the semiconductor fabrication process, it is often necessary to impart impurities into a pure material. Called "doping," this process invests the material with desirable properties, such as enhanced electrical conductivity. In many processes, it is advantageous to implant various atoms or ions into a semiconductor or semiconductor derivative substrate. For example, boron, phosphorus, and arsenic atoms or ions are routinely implanted into silicon substrates to create "doped" regions to serve as source and drain regions for solid state transistors. In some cases, the substrate is prepared prior to doping by "amorphizing" the region of the substrate to be doped. The crystal structure of the substrate is disrupted by bombardment with silicon, germanium, or argon atoms, creating channels for dopants to penetrate deeper into the substrate. In other applications, nitrogen, oxygen, hydrogen, carbon, fluorine, and various metals, such as indium, antimony, cobalt, and nickel, may be used as dopants to control electrical conductivity or diffusion at interfaces.

Dopants are generally implanted in two ways. In some processes, dopants may be implanted on the surface of a substrate and then heat treated to cause them to diffuse into the substrate. In other processes, dopants may be ionized into a plasma and then driven energetically into the substrate using an electric field. The substrate is then heat treated to normalize distribution of dopants and repair disruption to the crystal structure caused by ions barreling through at high speed. In both types of processes, the heat treatment anneals the substrate, encouraging dopant and ambient atoms located at interstitial positions in the crystal to move to lattice points. This movement "activates" dopants in applications involving control of electrical properties by making the electrical properties of the dopants communicable through the crystal lattice, and it generally strengthens the crystal, which may be important for diffusion control applications.

Even distribution of dopants throughout the target region is generally desired. For applications involving control of electrical conductivity, even distribution of dopants ensures uniform properties throughout the target region. For applications involving control of diffusion, even distribution of dopants ensures no open diffusion pathways for unwanted migration of atoms. For applications involving amorphization, even distribution of dopants ensures uniform density of pathways for subsequent dopants. Heat treatment after implanting promotes even distribution of dopants through the target region.

For more than half a century, the semiconductor industry has followed Moore's Law, which states that the density of transistors on an integrated circuit doubles about every two years. Continued evolution of the industry along this path will require smaller features patterned onto substrates. Stack transistors currently in production have dimensions of 50 to 100 nanometers (nm). The next generation of devices may have dimensions of about 40 nm, and design efforts are being directed toward devices with dimension of 20 nm and smaller. As devices grow smaller, the aspect ratio (ratio of height to width) of features patterned on substrates grows. Devices currently in production may have features with aspect ratio up to about 4:1, but future devices will require aspect ratios potentially up to 100:1 or higher.

Increasing aspect ratios and shrinking devices pose challenges to dopant implantation processes. It is frequently necessary, for example, to implant dopants at the bottom and on the sides of trenches in a field region of a substrate to form features. Energetic implantation processes are directional, with the electric field tending to drive ions in a direction orthogonal to the surface of the substrate. Ions readily impinge on the field region on the substrate, and may penetrate into trenches a short distance, but the electrical bias will drive the ions toward the surface of the field region or side walls of the trenches, preventing them from penetrating to the bottom of the trench. High energy implantation may drive ions to the bottom of the trench, but generally will not achieve conformal implantation and may result in over-implantation in the bottom of the trench and in field areas as compared to side walls.

FIGS. 1A-1D illustrate substrates subjected to conventional implantation techniques. FIG. 1A illustrates substrate 100 featuring field regions surrounding implantation process. A process free of plasma will implant a layer 102 primarily on the field regions, and may implant a layer 104 in the bottoms of the trenches, but any implantation on the side walls will be slow to occur, and layers 102 will grow toward each other as implantation occurs, reducing the opportunity for entry into trenches. FIG. 1C illustrates the implanted layers 102 and 104 after annealing (layers 106 and 108, respectively). Layers 106 feature bulges frequently encountered with conventional implantation, and layers 108 illustrate the tendency of implanted materials to collect in corners. In some processes, the substrate may be rotated to change the angle of incidence, as shown in FIG. 1D, such that the opportunity for precursor materials to penetrate trenches is enhanced. This may result in increased implantation 110 on a portion of sidewall 112. However, any such benefit is minimal, particularly for very high aspect ratio structures, because electric field lines driving the motion of ions are orthogonal to the surface. Thus, stage rotation does not result in conformal implantation or doping.

Therefore, there is a need for a method of conformal doping of high aspect ratio structures on substrates.

SUMMARY OF THE INVENTION

Embodiments of the present invention generally provide a method of processing a substrate, comprising disposing the substrate in a process chamber; providing a first precursor material to the process chamber; reacting the first precursor material to form a layer of the first precursor on the substrate; providing a second precursor material to the process chamber; reacting the second precursor material to form a layer of dopant atoms on the substrate; repeating the cycle until the layer of dopant atoms reaches a target thickness; and diffusing the layer of dopant atoms into the substrate by heating the substrate.

Embodiments of the present invention further provide a method of processing a substrate having trenches, comprising disposing the substrate in a process chamber; providing a process gas mixture to the process chamber, wherein the process gas mixture comprises a dopant precursor; ionizing the dopant precursor into a plasma comprising dopant ions inside the process chamber; generating an electric field configured to maximize penetration of the dopant ions into the trenches of the substrate; and depositing the dopant ions conformally on the substrate.

Embodiments of the present invention further provide a method of forming a doped region on a surface of a semiconductor substrate, comprising disposing the substrate in a process chamber; providing a catalytic precursor to the process chamber; ionizing the catalytic precursor into an isotropic plasma; reacting the catalytic precursor to form a layer of catalytic precursor on the substrate; providing a purge gas to the process chamber; providing a dopant precursor to the process chamber; ionizing the dopant precursor into an isotropic plasma; reacting the dopant precursor to form a layer of dopants on the substrate; repeating the cycle of precursors until the layer of dopants reaches a target thickness; and diffusing the layer of dopants into the substrate by heating the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

For clarity, identical reference numerals have been used, where applicable, to designate identical elements that are common between figures. It is contemplated that features of one embodiment may be incorporated in other embodiments without further recitation.

DETAILED DESCRIPTION

Figure 1A:
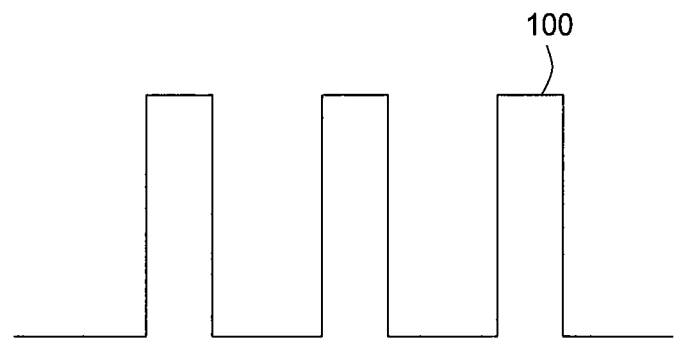
FIGS. 1A-1D illustrate a substrate treated according to prior art doping processes.
Figure 1B:
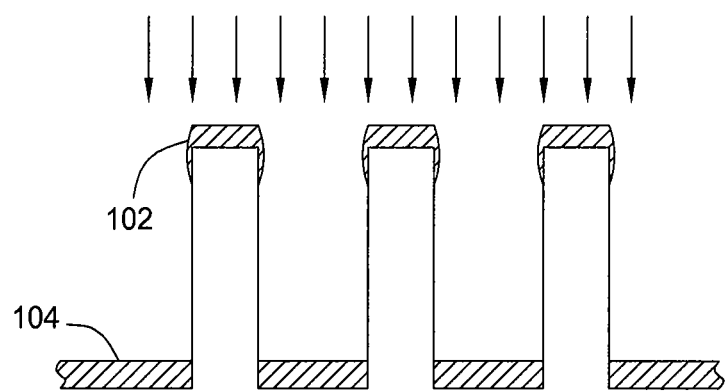
Figure 1C:
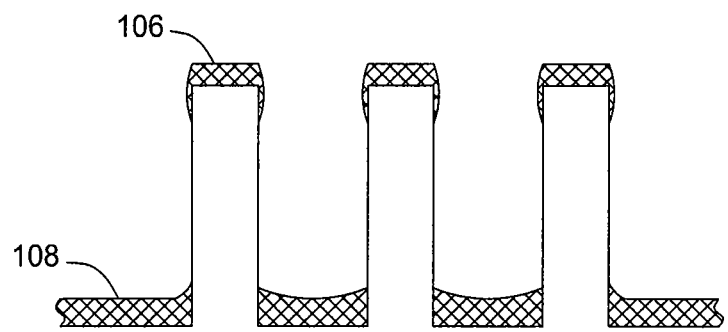
Figure 1D:
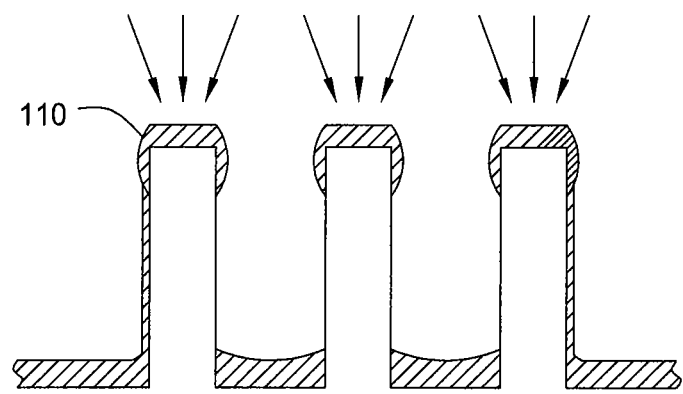

Embodiments of the invention contemplate methods of conformal doping of a substrate. Such methods generally provide for conformal deposition of a dopant source on a substrate followed by treatment with electromagnetic energy to diffuse the dopants into the substrate and activate them. Deposition may be by any process designed to achieve conformal deposition of thin dopant source layers on a substrate having high aspect ratio features, such as greater than about 3:1 by atomic layer deposition (ALD), chemical vapor deposition enhanced by weak plasma (WPCVD), or plasma-assisted atomic layer deposition (PAALD) of dopants on the substrate followed by anneal. Processes for manufacturing semiconductor devices are increasingly challenged to produce conformally doped regions on substrates with ultra-high aspect ratio holes or trenches formed in field regions. ALD is a successful procedure for forming conformal layers on high aspect ratio features heretofore used in metal and dielectric deposition processes. Embodiments of the current invention provide processes that adapt ALD techniques to conformal deposition of dopant atoms on a substrate, with or without the assistance of plasma.

Embodiments of the present invention use ALD processes to deposit conformal layers of dopants in a doping process. In one set of embodiments, a conformal layer of dopants is deposited on a substrate, which may have very high aspect ratio holes or trenches formed thereon. The dopants are then driven into the substrate in an anneal process designed to diffuse the dopants into the substrate and "activate" them, or encourage them to occupy positions at lattice points in the crystal structure. The deposition process may be an ALD process, a WPCVD process, or a PAALD process. The anneal process may be a rapid thermal process, in which the substrate is quickly heated to a target temperature, held at that temperature for a predetermined amount of time, and then quickly cooled. The anneal process may also be a spike anneal process, in which the substrate is subjected to a temperature spike, a laser anneal process, a pulsed electromagnetic energy anneal process, or a furnace anneal process.

Conformal Doping by ALD

ALD processes typically feature execution of self-limiting surface-catalyzed chemical "half-reactions" wherein a first precursor reacts with the substrate and is deposited thereon, and then a second precursor reacts with the deposited first precursor to yield an atomic layer of the desired component deposited on the substrate. These techniques have commonly been used to deposit metal layers, metal oxide layers, metal nitride layers, and metal derivative layers of more complex chemistry by sequential pulsing of precursors containing the desired elements in binary, tertiary, quaternary, or higher-order cycles.

Generally, a first precursor is provided to a reaction chamber in a pulse, depositing on the surface of a substrate disposed in the reaction chamber. The first precursor is generally a catalytic species selected to promote formation of a conformal monolayer on the surface. The first precursor reacts with reaction sites on the surface of the substrate until all such reaction sites are consumed, after which reaction stops. A monolayer of catalytic species is generally left on the surface. Any excess of the first precursor is removed from the reaction chamber by purging with a non-reactive gas. A second precursor is then provided to the reaction chamber in a pulse. The second precursor may be another catalytic species, or a precursor to the species to be deposited on the surface, such as a dopant precursor. The second precursor reacts with adsorbed catalytic species to yield a monolayer of the second precursor, which may be a catalytic species or the target deposition species, such as a metal species or dopant species. Further precursor steps may be used to progress the formation of a deposited monolayer in multiple self-limiting deposition steps. Monolayer after monolayer may then be deposited in repeated cycles until a smooth conformal layer of the desired thickness has been formed.

In metal oxide deposition processes, the first precursor is generally an oxygen-containing compound selected to terminate the surface with hydroxyl groups. The hydroxyl groups serve to catalyze reaction with a metal-containing compound to deposit a conformal monolayer of a metal oxide on the surface. The second precursor is generally a metal-containing compound featuring relatively massive ligands, such as alkyl amino groups for example, that may be liberated by relatively facile reactions. The second precursor deposits on the substrate when the metal complexes with local Lewis base sites, such as the adsorbed hydroxyl groups, on the substrate, liberating some of the ligands as volatile compounds.

After all the available sites have been consumed, reaction stops and any excess metal precursor is removed from the reaction chamber. ALD is said to be "self-limiting" because the reaction does not proceed beyond deposition of a single layer due to consumption of available reaction sites for the surface-catalyzed reaction. This enables deposition of conformal layers on very high aspect ratio structures.

Oxygen precursor is then provided in a pulse, and reacts with adsorbed metal precursor to yield a monolayer of metal oxide on the surface of the substrate, liberating remaining ligands and leaving a catalytic hydroxyl group on the surface. Again, when the available reaction sites are consumed, reaction stops. The metal precursor/oxygen precursor cycle may then be repeated, depositing monolayer after monolayer, until a smooth, conformal layer of the desired thickness has been formed.

Pathways are known, as well, for depositing metals by ALD processes. The catalytic species is generally a reducing agent that terminates the surface with hydrogen atoms. The surface is prepared by treating with the reducing agent. A metal precursor is then adsorbed onto a substrate, after which the reducing agent is pulsed into the reactor. The reducing agent leaves a monolayer of metal on the substrate.

Figure 2:
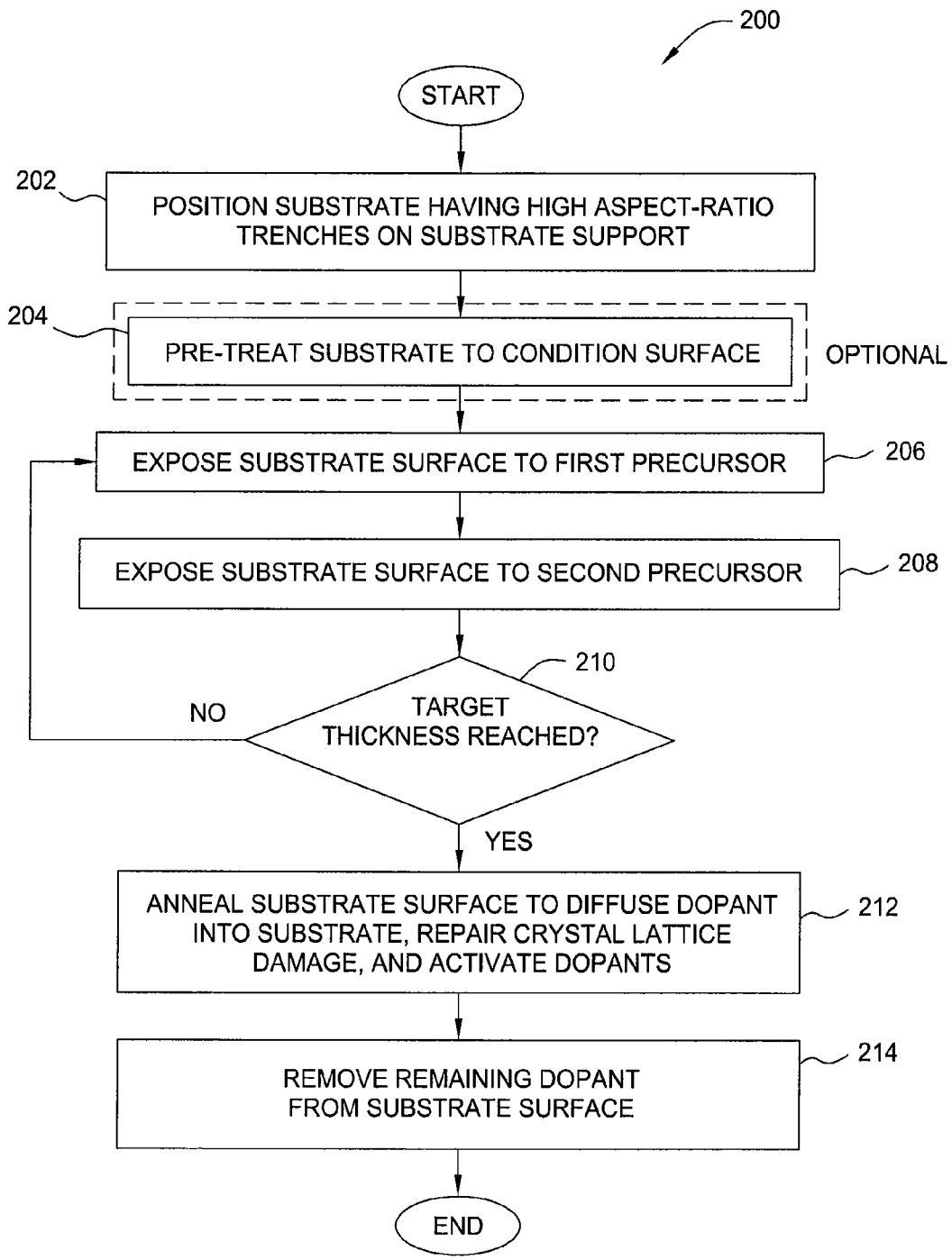
FIG. 2 is a process flow diagram according to one embodiment of the invention.

In one set of embodiments, a substrate is conformally doped by an ALD process followed by an anneal process. FIG. 2 illustrates a conformal doping process 200 using an ALD method according to one embodiment of the invention. A conformal dopant source layer is deposited on the surface of the substrate to a desired thickness and driven into the substrate and activated, if necessary, by the anneal process. The dopant source layer may be a phosphorus, arsenic, fluorine, boron, metal, or silicate layer, depending on the embodiment and the desired dopant. A capping layer may be used in some embodiments to facilitate the anneal process, which may be a rapid or spike thermal process, a laser or pulsed electromagnetic energy process, or a furnace anneal process.

A boron, phosphorus, or arsenic source layer may be deposited by an ALD process in some embodiments of the invention. A substrate to be doped is provided to a process chamber and positioned on a substrate support in step 202. The substrate may be held in place by vacuum or electromagnetic means. The substrate support may be configured to deliver a compound to the back side of the substrate through the surface of the substrate support for thermal control or control of back-side and edge deposition. Additionally, the substrate support may itself be heated or cooled resistively or by flowing a thermal control medium through conduits in the support for direct thermal control of the back side of the substrate. The substrate may have very high aspect ratio fholes or features, such as greater than about 10:1. The process chamber may be configured to perform one or more deposition, cleaning, thermal, or electromagnetic energy processes. The surface of the substrate may optionally be pretreated in step 204 to condition it for processing. For example, the surface may be cleaned using a liquid composition or plasma pre-clean process. It may also be treated to deposit reactive sites on the surface prior to the first ALD cycle.

A first precursor, which may be a catalytic precursor, is provided to the process chamber containing the substrate to be doped in step 206. If the first precursor is an oxidizing agent, it will react to form a terminal hydroxyl group layer, liberating remaining ligands bonded to the dopant on the surface. If the first precursor is a nitriding agent, terminal amino groups may be left in a similar fashion. If a silicate layer is to be the dopant source, such as borosilicate glass (BSG), phosphosilicate glass (PSG), or borophosphosilicate glass (BPSG) for example, a silicon-containing compound may be provided as the first precursor. Precursors useful for this step include, but are not necessarily limited to, oxygen ($O_2$), ozone ($O_3$), nitrous oxide ($N_2O$), water ($H_2O$), alcohols (e.g., ROH, where R is an aliphatic, cyclic, or aromatic organic functional group), peroxides (organic and inorganic), carboxylic acids, and radical oxygen compounds (e.g., O, $O_2$, $O_3$, and OH radicals), which may be generated by heat, hot wires, and/or plasma. Suitable nitrogen precursors include, but are not necessarily limited to, ammonia ($NH_3$), nitrogen gas ($N_2$), hydrazines (e.g., $N_2H_4$ or $MeN_2H_3$), amines (e.g., RR'R"N, where R, R', and R" may each be hydrogen or the same or different organic functional groups), anilines (e.g., $C_6H_5NH_2$), organic and inorganic azides (e.g., $MeN_3$, $Me_3SiN_3$, $NaN_3$ or $Cp_2CoN_3$), and radical nitrogen compounds (e.g., $N_3$, $N_2$, N, NH, or $NH_2$ radicals), which may be formed by heat, hot-wires, and/or plasma. Suitable silicon precursors include, but are not necessarily limited to, silanes, functionalized silanes (e.g., alkyl-, alkoxy-, or alkylamino-silanes), silanols, and functionalized silanols.

A second precursor, which may be a dopant precursor, is provided to the process chamber containing the substrate to be doped in step 208. The second precursor may be a boron containing compound, a phosphorus containing compound, an arsenic containing compound, a metal containing compound, or a fluorine containing compound. In general, compounds useful in this regard are hydrides such as boranes, phosphines, or arsines, organic moieties such as alkyl-, cyclic alkyl-, or aryl-boranes, borides, borates, phosphines, phosphides, phosphates, arsines, arsenides, or arsenates. Additionally, moieties featuring heterosubstituted groups may also be useful, such as amino-, alkylamino-, or arylamino-dopant precursors. In general, compounds may be selected for an ALD process based on their usability in standard CVD processes and their ability to adhere to a substrate surface under reasonable process conditions. Two exemplary precursors that may be used for depositing a phosphorus dopant source layer are trimethylphosphide and trimethylphosphate.

The boron, phosphorus, or arsenic containing compound may be provided to the reaction chamber in one or more pulses and allowed to adhere to the substrate. An organoboron compound, for example, may adhere to a hydroxyl-terminated substrate surface, liberating some organic components. After substantially all reaction sites are consumed by the precursor, excess may be purged or pumped from the chamber in preparation for the next phase of the cycle.

The second precursor reacts with the first precursor adsorbed onto the surface of the substrate until reaction sites are substantially consumed. The second precursor may then be purged from the reaction chamber. If a simple oxide or nitride layer is desired as the dopant source, a complete monolayer of dopant source material will cover the substrate surface conformally after the second precursor deposits. If higher chemistry layers are desired, subsequent precursors are provided to complete the step-wise ALD process.

The precursor cycles may be repeated until the desired thickness of the dopant source layer is reached, as illustrated by step 210. After the desired thickness is reached, the substrate is subjected to an annealing treatment to diffuse the dopants into the substrate, activate the dopants, and repair crystal lattice damage in step 212. Step 212 may be performed in one or more treatment cycles, such as by rapidly heating the substrate to a target temperature, holding that temperature for a predetermined time, and cooling the substrate rapidly to an ambient temperature, or by subjecting the substrate to a temperature spike. In alternate embodiments, the treatment cycles may be the same or different.

Multiple embodiments of the ALD process described above may be useful. It may be advantageous, in some embodiments, to pump-down or evacuate the chamber entirely between precursor cycles by closing all inlet pathways and applying vacuum. In some embodiments, the precursor pathways may also be purged with a non-reactive gas between precursor deposition cycles. In still other embodiments, purge gas may flow through one or more precursor pathways into the process chamber continuously, and the process chamber may be purged of excess precursor by stopping flow of the precursor gas while continuing flow of the purge gas. Still other embodiments may combine these features. Any of these embodiments may be used to deposit conformal dopant layers on substrates.

Conformal Doping by Plasma Deposition

Figure 3:
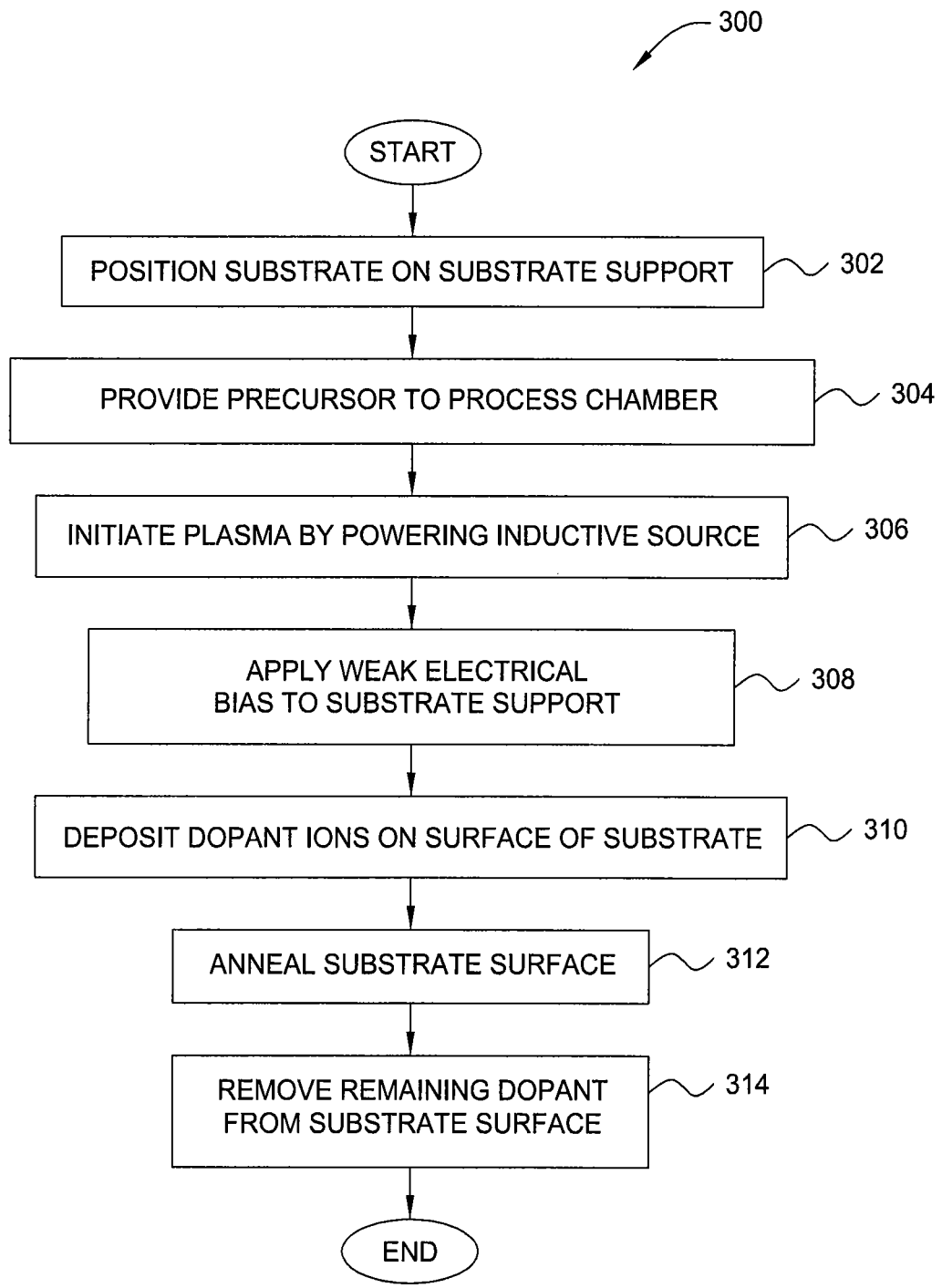
FIG. 3 is a process flow diagram according to another embodiment of the invention.

Conformal doping may be performed using a plasma-enhanced deposition process. FIG. 3 illustrates such a process. The process 300 begins by positioning a substrate having high aspect-ratio features on a substrate support in a process chamber in step 302. The substrate may be held in place by vacuum or electromagnetic means, and the substrate support may be configured as described above for thermal control of the substrate. As also described above, the process chamber may be configured to perform one or more deposition, cleaning, thermal, or electromagnetic energy processes.

A dopant precursor material is provided to the process chamber in step 304. The dopant precursor is selected to adhere to the substrate surface when activated by ionizing into a plasma. Dopant precursors useful for this purpose include, but are not necessarily limited to, boron compounds (I.e. boranes, borates, or borides), phosphorus compounds (I.e. phosphines, phosphates, or phosphides), arsenic compounds (I.e. arsines, arsenates, or arsenides), silicon compounds (I.e. silanes, siloxanes, silanols), nitrogen compounds ($N_2$, $NH_3$, $N_2O$), hydrogen ($H_2$), oxygen ($O_2$). Some exemplary compounds which may be useful for conformal doping embodiments such as process 300 are borane, diborane, phosphine, arsine, silane, nitrogen ($N_2$), hydrogen ($H_2$), and oxygen ($O_2$).

The dopant precursor is ionized into a plasma in step 306. The plasma may be capacitatively, or preferably inductively, coupled. An inductively coupled plasma may be generated by creating an electric field through which a portion of the reaction mixture passes. The field is usually generated by passing an oscillating electric current through a coil disposed around a passage containing the material, such as the dopant precursor, to be ionized. The oscillating electric field is preferably generated at relatively low power, such as less than about 1000 Watts (W), and most preferably below about 500 W. Such a low-power plasma, or weak plasma, enhances the tendency of the precursors to react with or adsorb onto the substrate, while minimizing unwanted deposits on process apparatus. The frequency of the oscillating electric field is normally about 13.56 MHz, which is radio frequency (RF). An inductively-coupled plasma of this type may be generated inside the process chamber, in a loop adjacent to the process chamber, or in a remote plasma generation apparatus.

Generating an inductively coupled plasma by application of RF power through an inductor coupled to a portion of the chamber may additionally be accompanied by application of an electrical bias, as in step 308. Electrical bias may be generated by applying RF power with a high- or low-pass filter, or DC power, to one or more components bordering the reaction space, such as the gas distributor, substrate support, or chamber wall. The bias is preferably oriented such that ions are propelled toward the substrate, and is preferably weak (i.e. less than 500 W) such that charged particles will penetrate deeply into trenches before veering toward the side walls, and so that charged particles will deposit on the surface of the substrate rather than implanting into the surface. Although an isotropic reaction mixture is preferred, application of a weak electrical bias encourages ions to penetrate into trenches without discouraging deposition on side walls. In this way, conformal implantation and doping is achieved.

In addition to inductive coupling, plasma may be generated by capacitative coupling, wherein the electric field is generated between the plates of a capacitor. Similar to the method described for generating electrical bias in the process chamber described above, voltage may be applied to one or more components of the reaction chamber to generate the electric field. RF power is generally used, but DC power may also be used. A weak plasma is preferred in such an embodiment.

Following deposition of dopant source material on the surface of the substrate in step 310, the substrate is annealed in step 312 to activate the dopants and diffuse them into the crystal structure of the substrate.

Plasma-Assisted ALD

Some conformal doping embodiments may benefit from the use of a plasma-assisted ALD (PAALD) method. In a PAALD process, reaction of the precursors with the substrate, or with other precursors adsorbed onto the substrate, is encouraged or enhanced by ionization of precursor species. A plasma is produced which reacts more readily to deposit layers of dopant. Plasma may be inductively or capacitatively coupled, with or without electrical bias applied.

Figure 4:
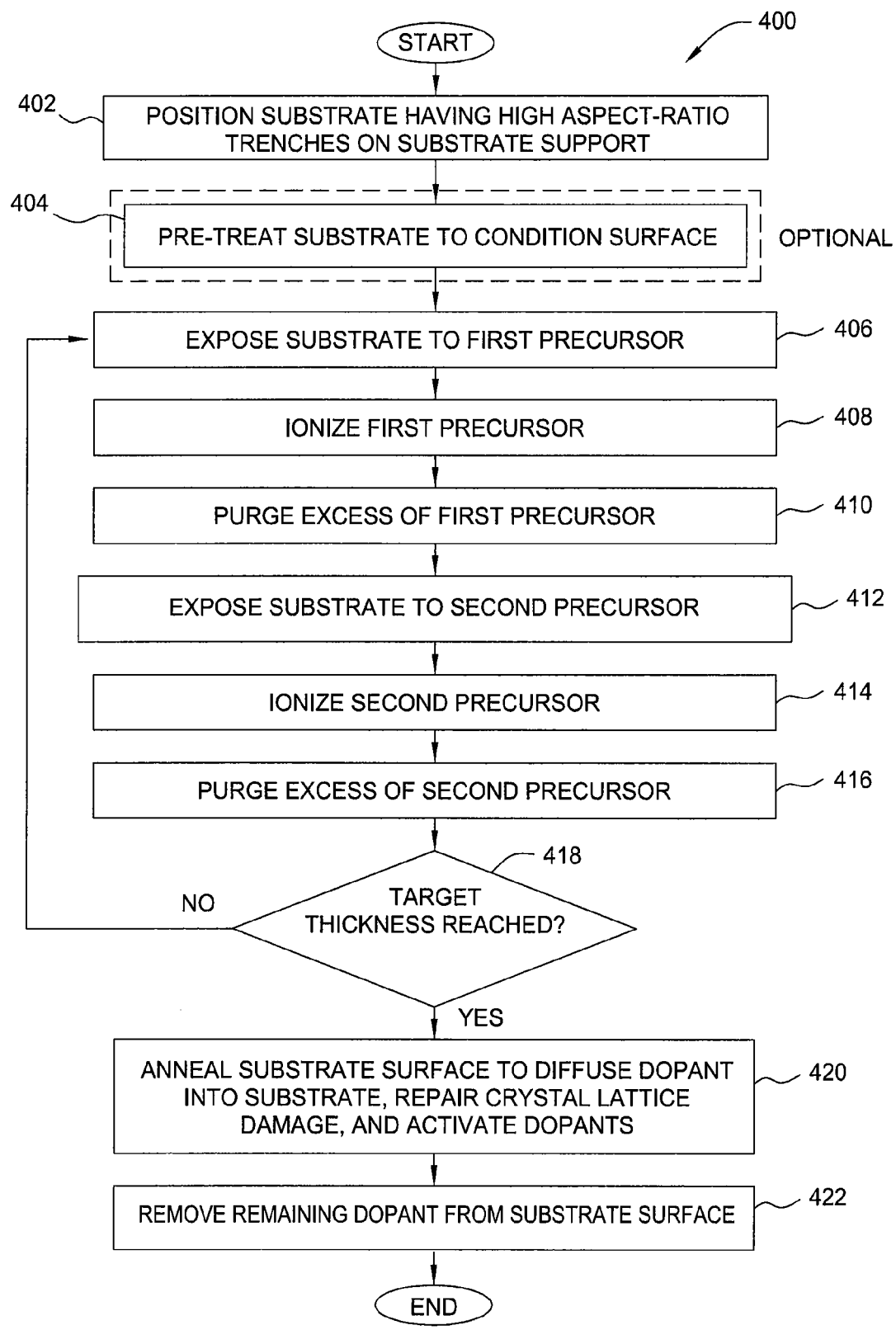
FIG. 4 is a process flow diagram according to another embodiment of the invention.

FIG. 4 is a process flow diagram illustrating a PAALD process 400 according to one embodiment of the invention. A substrate having high aspect-ratio features is provided to a process chamber and disposed on a substrate support, such as those discussed above, in step 402. Portions of the surface of the substrate may optionally be pre-treated in step 404 to clean or condition the surface of the substrate, such as wet cleaning, plasma cleaning, or functional termination (i.e. hydroxyl, amino, or hydrogen termination). In step 406, a first precursor, which may be a catalytic precursor as described above, is provided to a process chamber. The chamber may be purged or evacuated before the first precursor is provided, as also described above.

The first precursor, which may be a catalytic precursor, may be ionized into a plasma to aid deposition in step 408. The plasma may be generated by capacitative, or preferably by inductive coupling, and may be generated inside the process chamber, or in an apparatus adjacent to or remote from the process chamber. RF power is applied at a frequency of 13.56 MHz to generate the plasma. As described above, the RF power preferably generated at power levels less than 1000 W, and most preferably below 200 W, is applied to an inductor disposed around a passage containing the material to be ionized, such as the first precursor. A weak plasma will aid deposition of precursors onto the substrate surface. The plasma may be biased, but is preferably unbiased or electrically neutral. An unbiased plasma is most likely to be isotropic throughout the process chamber, leading to conformal doping. A weak bias, such as that generated by less than 500 W of power, may result in substantially conformal deposition for high aspect ratio strictures as well.

RF power may be applied to one or more precursors, if desired, to enhance results. For example, a dopant precursor may be activated by RF power, if desired, and the RF power discontinued during application of the oxygen or nitrogen source, or other catalytic precursor. The catalytic precursor may also be activated or ionized by RF power into a plasma. An oxygen or nitrogen plasma may be formed thereby. In embodiments featuring more than two precursors, it may be advantageous to apply RF power to the various precursors in many different combinations.

RF power may be continued during purge steps 410 and 416 as well, if desired. RF power during purge steps may have the added benefit of reducing the presence of precursors that may have adsorbed onto the walls and piping of the reaction chamber. Purge gases ionized into a weak plasma may be effective in removing such deposits from the walls and from the chamber. Purge steps may also be performed after discontinuing RF power.

As with any ALD process, deposition proceeds in cycles. The precursors may be sequentially provided to the process chamber, with or without plasma in specific cases, to form a dopant layer or dopant source layer of the desired thickness. As illustrated by step 418, if the target thickness is not reached, deposition cycles may be repeated. Plasma may be used to varying degrees, if desired, to further tune the deposition process. For example, alternate cycles may feature plasma.

When the target thickness of the dopant source layer deposited on the substrate is reached in step 418, the substrate may be annealed to complete process 400. The substrate is annealed in step 420 to diffuse dopants from the dopant source layer into at least portions of the surface of the substrate, and may be used to activate the dopants, and repair crystal lattice damage. Annealing may be performed in one or more thermal treatment cycles, such as rapid thermal processing, spike annealing, laser or pulsed laser annealing, flash or pulsed flash lamp annealing, or furnace annealing, which may be the same or different.

Figure 5A:
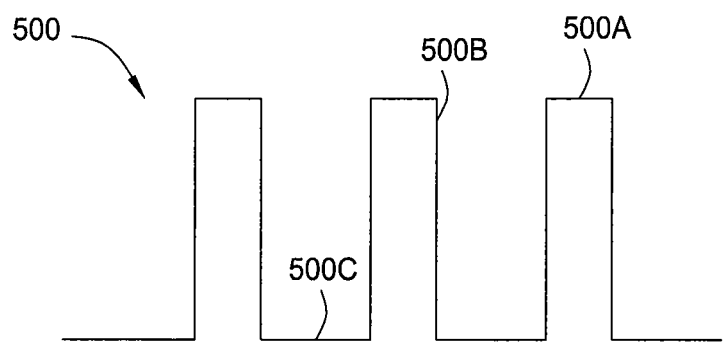
FIGS. 5A-5C illustrate a substrate treated according to any of the processes depicted in FIGS. 2-4.
Figure 5B:
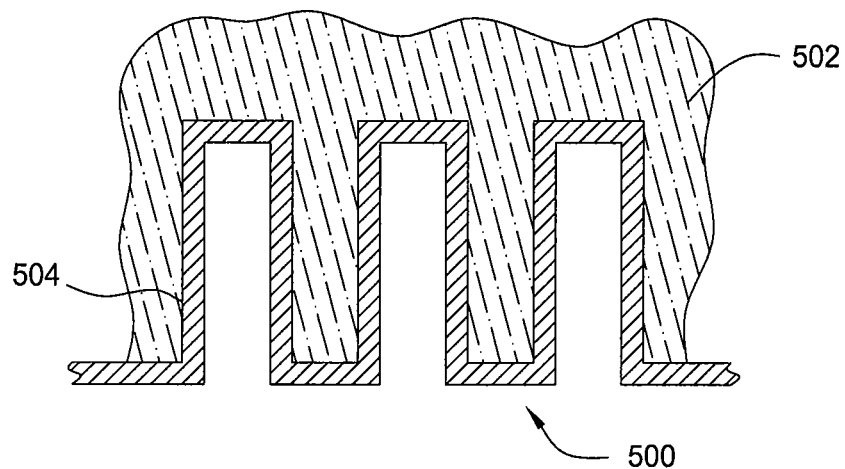
Figure 5C:
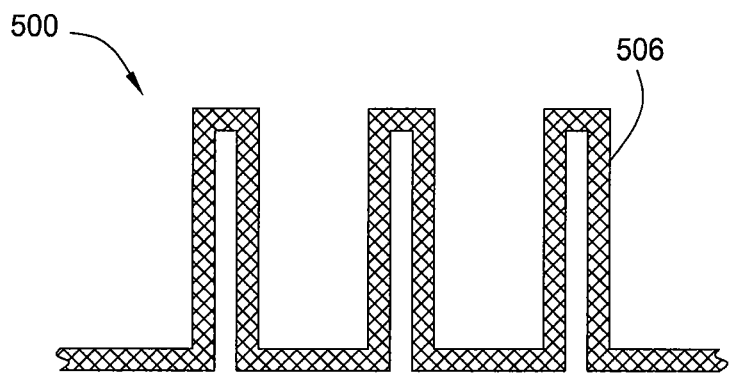

FIGS. 5A-5C illustrate a substrate at various stages corresponding to process steps discussed above. FIG. 5A illustrates a substrate 500 with high aspect-ratio features. It is desired to produce a conformal doping on the top surfaces 500A, sidewalls 500B, and in the trenches 500C of substrate 500. FIG. 5B illustrates the substrate 500 at an intermediate stage when a dopant source material is being conformally deposited. A precursor material 502 is illustrated distributed isotropically through the process chamber, such that concentration of precursor is substantially the same near the top surfaces 500A, the sidewalls 500B, and the trenches 500C of the substrate. A conformal layer of dopant source material 504 grows over substrate 500. FIG. 5C illustrates the effect after thermal treatment. Conformal layer 504 has been driven into substrate 500 and activated to form conformal doped layer 506.

Activation

Dopant source material deposited on the surface of a substrate must be treated to promote diffusion into the substrate and to activate the dopants. Conformal doping embodiments also include activation steps. Any dopant diffusion process may be used to accomplish activation, such as rapid thermal processing or annealing, spike annealing, laser annealing, flash, pulse, or furnace annealing, or the like. In some embodiments, a capping layer may be used advantageously to promote the diffusion and activation process. The capping layer may be deposited over the entire substrate, or only over portions of the substrate, to achieve the desired thermal treatment result.

A substrate with deposited dopant source material may be treated by thermal or electromagnetic annealing in the same chamber used to deposit the dopant source material or in one or more different chambers. For example, dopant source material may be deposited in a chamber configured to perform a PAALD process, and then transferred to a thermal treatment chamber for annealing. The thermal treatment chamber may be configured to heat or cool the entire substrate, using heat lamps for example, or only a portion of the substrate, as with lasers or flash lamps or back-side cooling configurations. The substrate support may be temperature controlled to facilitate annealing.

Dopant atoms in the dopant source layer are energized by the treatment and move into the substrate. In some embodiments, it may be advantageous to apply a capping layer before annealing to prevent escape of fugitive dopants during thermal processing. Use of a capping layer may also serve to equalize thermal load on the tops and sidewalls of structural features on the surface of the substrate. Portions of the substrate are generally heated to a temperature selected to encourage movement of dopants into the substrate and ordering of the substrate crystal structure. The target temperature may be from about 700° C. to about 1410° C., and may be selected to partially melt portions of the substrate. Selective melting may be used to encourage local rearrangement of dopant and substrate atoms to facilitate the activation and diffusion process. The substrate may be controlled at an ambient temperature between about 100° C. and about 700° C. between heating cycles to facilitate rapid heating. Heating and cooling cycles are preferably rapid to facilitate control of diffusion and activation. For example, a heating cycle that raises the temperature of the substrate too slowly may result in over-diffusion of dopants into the substrate or liberation of previously activated dopants. Temperature ramp rates exceeding 400° C./second are generally preferred. Cooling cycles generally follow heating cycles to solidify or freeze migrated or activated dopant or substrate atoms in place.

Following the anneal process, small amounts of the dopant source layer may be left on the surface of the substrate. In general, anneal processes will result in a concentration gradient of dopants in the surface of the substrate, with the highest concentration being near the surface. In some embodiments, a dopant source layer on the surface of the substrate, and a high-concentration dopant layer just below the surface of the substrate, may be removed after annealing. A cleaning process, such as an etching, plasma cleaning, or plasma etching process, may be used to remove the unwanted species.

Apparatus

Figure 6A:
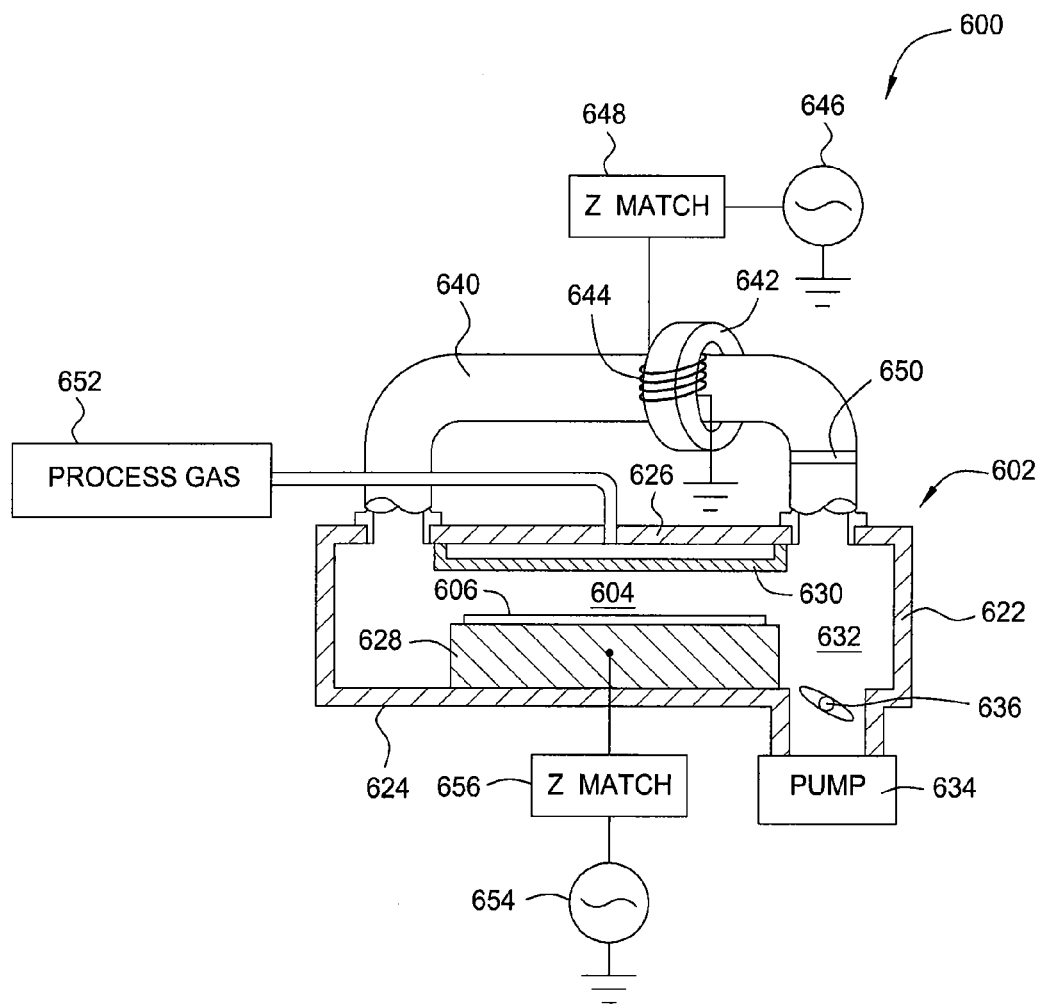
FIG. 6A is a cross-sectional side view of an apparatus for processing a substrate according to one embodiment of the invention.

FIG. 6A is a schematic cross-section diagram of an apparatus according to one embodiment of the invention. The apparatus illustrated is configured to perform plasma-assisted processes such as plasma implantation of dopants in a substrate. The plasma reactor 600 includes a chamber body 602 having a bottom 624, a top 626, and side walls 622 enclosing a process region 604. A substrate support assembly 628 is supported from the bottom 624 of the chamber body 602 and is adapted to receive a substrate 606 for processing. A gas distributor 630 is coupled to the top 626 of the chamber body 602 facing the substrate support assembly 628. A pumping port 632 is defined in the chamber body 602 and coupled to a vacuum pump 634. The vacuum pump 634 is coupled through a throttle valve 636 to the pumping port 632. A gas source 652 is coupled to the gas distributor 630 to supply gaseous precursor compounds for processes performed on the substrate 606. In some embodiments, gas distributor 630 may be a showerhead.

Figure 6B:
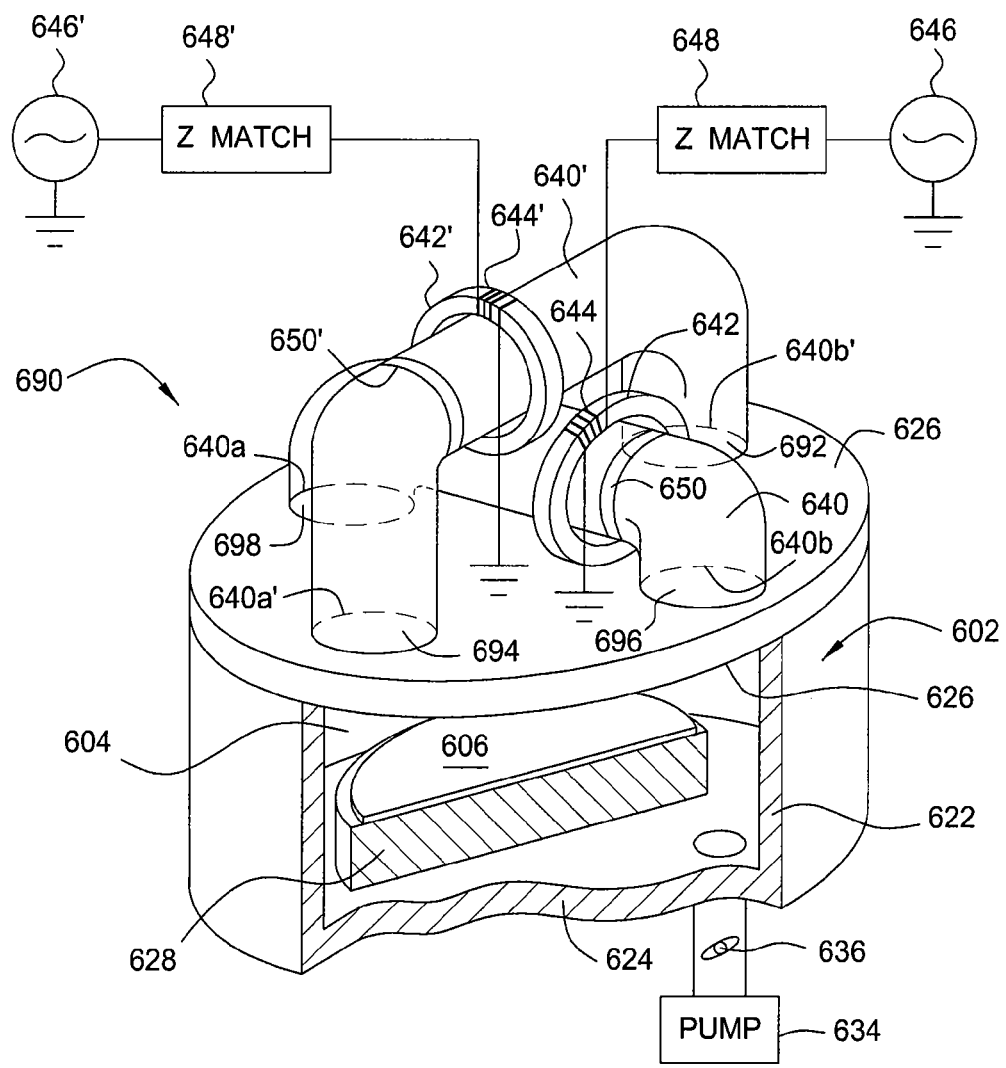
FIG. 6B is a perspective view of a plasma source according to one embodiment of the invention.

The reactor 600 depicted in FIG. 6A further includes a plasma source 690 best shown in the perspective view of FIG. 6B. The plasma source 690 includes a pair of separate external reentrant conduits 640 and 640', which may be curved tubes, mounted on the outside of the top 626 of the chamber body 602 disposed transverse to one another (or orthogonal to one another, as shown in the exemplary embodiment depicted in FIG. 6B). The first external conduit 640 has a first end 640*a* coupled through an opening 698 formed in the top 626 into a first side of the process region 604 in the chamber body 602. A second end 640*b* has an opening 696 coupled into a second side of the process region 604. The second external reentrant conduit 640' has a first end 640*a'* having an opening 694 coupled into a third side of the process region 604 and a second end 640*b'* having an opening 692 into a fourth side of the process region 604. In one embodiment, the first and second external reentrant conduits 640, 640' are configured to be orthogonal to one another, with the ends 640*a*, 640*a'*, 640*b*, 640*b'* of each external reentrant conduits 640, 640' disposed at about 90 degree intervals around the periphery of the top 626 of the chamber body 602. The orthogonal configuration of the external reentrant conduits 640, 640' allows a plasma source distributed uniformly across the process region 604. It is contemplated that the first and second external reentrant conduits 640, 640' may be reconfigured if other distributions are desired to provide uniform plasma distribution into the process region 604.

Magnetically permeable torroidal cores 642, 642' surround a portion of a corresponding one of the external reentrant conduits 640, 640'. The conductive coils 644, 644' are coupled to respective RF plasma source power generators 646, 646' through respective impedance match circuits or elements 648, 648'. Each external reentrant conduit 640, 640' is a hollow conductive tube interrupted by an insulating annular ring 650, 650' respectively that interrupts an otherwise continuous electrical path between the two ends 640*a*, 640*b* (and 640*a'*, 604*b'*) of the respective external reentrant conduits 640, 640'. Ion energy at the substrate surface is controlled by an RF plasma bias power generator 654 (FIG. 6A) coupled to the substrate support assembly 628 through an impedance match circuit or element 656.

Referring back to FIG. 6A, process gases including gaseous compounds supplied from the process gas source 652 are introduced through the overhead gas distributor 630 into the process region 604. RF source plasma power 646 is coupled to gases supplied in the conduit 640 by conductive coil 644 and torroidal core 642, creating a circulating plasma current in a first closed torroidal path including the external reentrant conduit 640 and the process region 604. Also, RF source power 646' (FIG. 6B) may be coupled to gases in the second conduit 640' by conductive coil 644' and torroidal core 642', creating a circulating plasma current in a second closed torroidal path transverse (e.g., orthogonal) to the first torroidal path. The second torroidal path includes the second external reentrant conduit 640' and the process region 604. The plasma currents in each of the paths oscillate (e.g., reverse direction) at the frequencies of the respective RF source power generators 646, 646', which may be the same or slightly offset from one another.

In one embodiment, the process gas source 652 provides different process gases that may be utilized to provide dopants to the substrate 606. The power of each plasma source power generators 646, 646' may be operated to dissociate the process gases supplied from the process gas source 652 and produce a desired ion flux at the surface of the substrate 606. The power of the RF plasma bias power generator 654 is controlled at a selected level at which the ion energy dissociated from the process gases may be accelerated toward the substrate surface and implanted at a desired depth below the top surface of the substrate 606 with desired ion concentration, or deposited on the surface of substrate 606. For example, with relatively low RF power applied to bias generator 654, such as less than about 50 eV, relatively low plasma ion energy may be obtained. Dissociated ions with low ion energy may be implanted at a shallow depth between about 0 Å and about 600 Å from the substrate surface, or merely deposited on the surface of substrate 606. Alternatively, dissociated ions with high ion energy provided and generated from high RF power, such as higher than about 50 eV, may be implanted into the substrate having a depth substantially over 100 Å depth from the substrate surface.

As has been discussed above, for conformal doping applications, it is preferable to generate at most weak electrical bias in the chamber. Strong bias, while maintaining vigorous activation of deposition species, results in heavy deposition on field regions and less deposition than desired in holes and trenches. Weak field regions, so better penetration into trenches is achieved. With no electrical bias, composition of the plasma is isotropic, and deposition is conformal on field regions and in trenches. In weak bias applications, RF bias generator 654 is preferably operated at a frequency of 13.56 MHz, and may be operated to best effect at a bias power level less than about 1000 W, or more preferably less than about 500 W, such as less than about 100 W.

Bias power generator 654 is shown coupled to substrate support 628 through matching network 656, with gas distributor 630 grounded. Bias power generator 654 applies a monopolar RF-driven electrical bias to plasma generated by external reentrant conduits 640 and 640'. In alternate embodiments, bias power generator 654 may be coupled to gas distributor 630, or separate bias circuits may be independently coupled to both gas distributor 630 and substrate support 628.

The combination of the controlled RF plasma source power and RF plasma bias power dissociates ions in the gas mixture having sufficient momentum and desired ion distribution in the plasma reactor 600. The ions are biased and driven toward the substrate surface, thereby implanting ions into the substrate with desired ion concentration, distribution and depth from the substrate surface, if sufficiently energized. Lower energy plasma bias power may result in deposition on the surface of the substrate with little penetration, as will generally be preferred in conformal doping applications. Furthermore, the controlled ion energy and different types of ion species from the supplied process gases facilitates ions implanted in, or deposited on, the substrate 606, forming desired device structure, such as gate structure and source drain region on the substrate 606.

Plasma reactor 600 may further comprise a chamber liner (not shown). Chamber liners are commonly provided to protect chamber walls from reactive components during processing. Such liners may be made of ceramic, silicon, or other protective materials, and may be designed to be replaced periodically. In alternate embodiments, the chamber may be chemically lined by depositing a silicon or oxide layer on the inside surface of the chamber prior to processing. An in-situ chamber liner of this sort serves the same function, and may be removed and replaced by etching or cleaning processes.

While the foregoing is directed to embodiments of the present invention, other and further embodiments of the invention may be devised without departing from the basic scope thereof, and the scope thereof is determined by the claims that follow.

What is claimed is:

1. A method of processing a substrate, comprising:
   (a) disposing the substrate in a process chamber;
   (b) providing a first precursor material to the process chamber, wherein the first precursor is a catalytic precursor selected from the group consisting of $O_2$, $O_3$, $N_2O$, H₂O₂, NO, N₂O₅ alcohols organic and inorganic peroxides carboxylic acids radical oxygen compounds, and combinations thereof;

(c) reacting the first precursor material to form a layer of the first precursor on the substrate;

(d) providing a second precursor material to the process chamber wherein the second precursor is a dopant precursor;

(e) reacting the second precursor material with the layer of the first precursor to form a dopant layer on the substrate;

(f) repeating steps (b) - (e) in sequence until the dopant layer reaches a target thickness; and (g) diffusing the dopant layer into the substrate by heating the substrate.

2. The method of claim 1, wherein the dopant precursor is selected from the group consisting of a boron precursor, a phosphorus precursor, an arsenic precursor, a metal precursor, a fluorine precursor, or combinations thereof.

3. The method of claim 1, wherein the dopant precursor is an organoboron compound.

4. The method of claim 1, wherein the dopant precursor is an organophosphorus compound.

5. The method of claim 1, wherein the dopant precursor is an organoarsenic compound.

6. The method of claim 1, further comprising annealing the substrate.

7. A method of forming a doped region on a surface of a semiconductor substrate, comprising:

(a) disposing the substrate in a process chamber;

(b) providing a catalytic precursor to the process chamber, wherein the catalytic precursor is selected from the group consisting of $O_2$, $O_3$, $N_2O$, $H_2O_2$, NO, $N_2O_5$, alcohols, organic and inorganic peroxides, carboxylic acids, radical oxygen compounds, and combinations thereof;

(c) ionizing the catalytic precursor into a catalytic precursor plasma;

(d) reacting the catalytic precursor plasma to form a layer of catalytic precursor on the substrate;

(e) providing a purge gas to the process chamber;

(f) providing a dopant precursor to the process chamber wherein the dopant precursor is selected from the group consisting of a boron compound, a phosphorus compound, an arsenic compound, a metal compound, a fluorine compound, or combinations thereof;

(g) ionizing the dopant precursor into a dopant precursor plasma;

(h) reacting the dopant precursor plasma to form a dopant layer on the substrate;

(i) repeating operations (b)-(h) until the dopant layer reaches a target thickness; and (j) diffusing the dopant layer into the substrate by heating the substrate.

* * * * *